United States Patent [19]

Brimhall

[11] Patent Number: 5,389,845

[45] Date of Patent: Feb. 14, 1995

[54] LINEAR ACTUATOR APPARATUS AND METHOD

[75] Inventor: Owen D. Brimhall, South Jordan, Utah

[73] Assignee: Technical Research Associates, Inc., Salt Lake City, Utah

[21] Appl. No.: 156,091

[22] Filed: Nov. 22, 1993

[51] Int. Cl.$^6$ .................................... H01L 41/12
[52] U.S. Cl. .................................................. 310/26
[58] Field of Search .................. 310/26; 318/118; 335/215

[56] References Cited

U.S. PATENT DOCUMENTS 5,013,945  5/1991  Adolfson .......................... 310/26
5,281,875  1/1994  Kiesewetter et al. ............. 310/26

Primary Examiner—Steven L. Stephan
Assistant Examiner—Judson H. Jones
Attorney, Agent, or Firm—J. Winslow Young

[57] ABSTRACT

A linear actuator and method whereby linear movement of a drive rod is achieved in a step-wise fashion using a pair of clamping members in conjunction with extension members. The body of the linear actuator is configured as a pair of housings, each with a clamping member and slidably receiving the extension member. Each clamping member is each actuated by a magnetostrictive rod. A third magnetostrictive rod slidably passes through both housings and ends in abutment with each clamping member. The clamping members selectively affix the respective housing to the drive rod while the extension member pushes one clamping member relative to the other clamping member. A spring resiliently urges the two housings together and thereby cooperates with the two clamping members and the extension member in moving the linear actuator along the length of the drive rod.

19 Claims, 2 Drawing Sheets

LINEAR ACTUATOR APPARATUS AND METHOD

GOVERNMENT RIGHTS

This invention was made at least in part under a Small Business Innovation Research grant of the Department of the Air Force administered by the Human Systems Division of the Air Force Systems Command, Brooks Air Force Base, and supervised by the Biodynamics and Biocommunications Division of the Armstrong Laboratory, Wright-Patterson Air Force Base, Contract Number F41624-92-C-6005. The United States of America is entitled to certain nonexclusive rights to this invention under this contract.

BACKGROUND

1. Field of the Invention

This invention relates to linear actuators and more particularly, to a novel linear actuator apparatus and method wherein a plurality of rods fabricated from a magnetostrictive material are used both as the motive force and the clamping forces for providing incremental movement between a steel drive rod and the linear actuator apparatus.

2. The Prior Art

A linear actuator, as the name implies, refers to a member of that family of actuators that move in a longitudinal or linear manner as distinguished from rotary actuators such as electric motors, reciprocatory engines, and the like, that operate on the principle of rotary motion. A hydraulic piston, for example, is one type of linear actuator and involves the flow of hydraulic fluid under pressure to move the piston in the appropriate direction as controlled by the valving sequence of the hydraulic fluid. Another type of linear actuator is the solenoid wherein the axial movement of a centrally disposed, spring-biased shaft is controlled by electromagnetic forces created with an electromagnetic coil surrounding the shaft. The solenoid is generally a simple on/off type device and is not well suited for fine adjustments of the shaft throughout its travel distance. Other linear actuators involve an axial rod having a worm gear system for translating the rotary motion of an electric motor, for example, into linear movement of the rod.

Another type of motive force in addition to the foregoing hydraulic and electromagnetic forces is that of a relatively new material known as a magnetostrictive material. As the name implies a magnetostrictive material changes length under the influence of an electromagnetic field. Actuator-type devices which take advantage of this change of length characteristic of magnetostrictive materials have been disclosed and include a hydraulic pump proposed by Cusack (U.S. Pat. Nos. 4,726,741; 4,795,317; 4,795,318; 4,804,314; and 4,815,946). In this device the piston for the hydraulic pump is constructed of a magnetostrictive material that is caused to extend under the magnetic influence of an electromagnetic field. In one preferred embodiment, the cylinder is constructed of a negative magnetostrictive material which decreases in length in the presence of the magnetic field.

Glomb, Jr. (U.S. Pat. No. 4,766,357) discloses a linear magnetostrictive actuator. This device includes demagnetization compensation having improved displacement accuracy.

Engdahl et al. (U.S. Pat. No. 4,927,334) disclose a liquid pump driven by rods of magnetostrictive material. The rods are arranged in pairs and surrounded by coils supplied with electrical current. The first rod and second rod cooperate in moving a piston in a cylinder to create the pumping action.

Teter et al. (U.S. Pat. No. 5,039,894) disclose a linear motor wherein the actuator rod of the linear motor is made of a magnetostrictive material.

Dixon (U.S. Pat. No. 5,101,183) discloses a clamp made of magnetostrictive materials. The clamp is designed to prevent electrical power conductors from being forced apart by the magnetic fields produced when high currents flow in the conductors. One proposed application is that involving the conductors in a railgun.

In each of these references, the driving element is made of a magnetostrictive material. However, magnetostrictive materials are not only expensive but also highly susceptible to wear if used as the driving element. It would, therefore, be an advancement in the art to provide a linear actuator wherein the force transmitting rod is fabricated from steel or some other suitable metal and where the motive elements of magnetostrictive material are confined as relatively small elements. It would also be an advancement in the art to provide a linear actuator wherein the magnetostrictive elements are configured such as to be protected against wear. Such a novel apparatus and method is disclosed and claimed herein.

BRIEF SUMMARY AND OBJECTS OF THE INVENTION

This invention is a linear actuator apparatus and method operable to move a drive rod axially in stepwise fashion in either direction. Three magnetostrictive elements are used to control the movement of the drive rod which is configured as a standard shaft. Two of the magnetostrictive elements provide selective clamping actions while the third provides the motive force for moving the actuator housing relative to the drive rod. Importantly and advantageously, the clamping functions and the motive function utilize the full potential of the magnetostrictive motion. The magnetostrictive elements are not part of the drive rod so that they are protected against wear. The linear actuator can be configured with any suitable length of drive rod and with the drive rod in either the normally locked position or the normally free position.

It is, therefore, a primary object of this invention to provide improvements in linear actuators.

Another object of this invention is to provide improvements in the method of actuating a drive rod linearly with drive elements fabricated from a magnetostrictive material.

Another object of this invention is to provide a magnetostrictive drive system for a linear actuator wherein the magnetostrictive elements do not form part of the actual wear surfaces.

Another object of this invention is to provide a linear actuator wherein a standard metal shaft having any suitable length can be used as the actuator rod.

Another object of this invention is to provide a linear actuator wherein the actuator rod can be configured as normally locked or normally free.

These and other objects and features of the present invention will become more readily apparent from the following description in which preferred and other embodiments of the invention have been set forth in conjunction with the accompanying drawing and appended claims.

DETAILED DESCRIPTION OF THE PREFERRED EMBODIMENT

Figure 1:
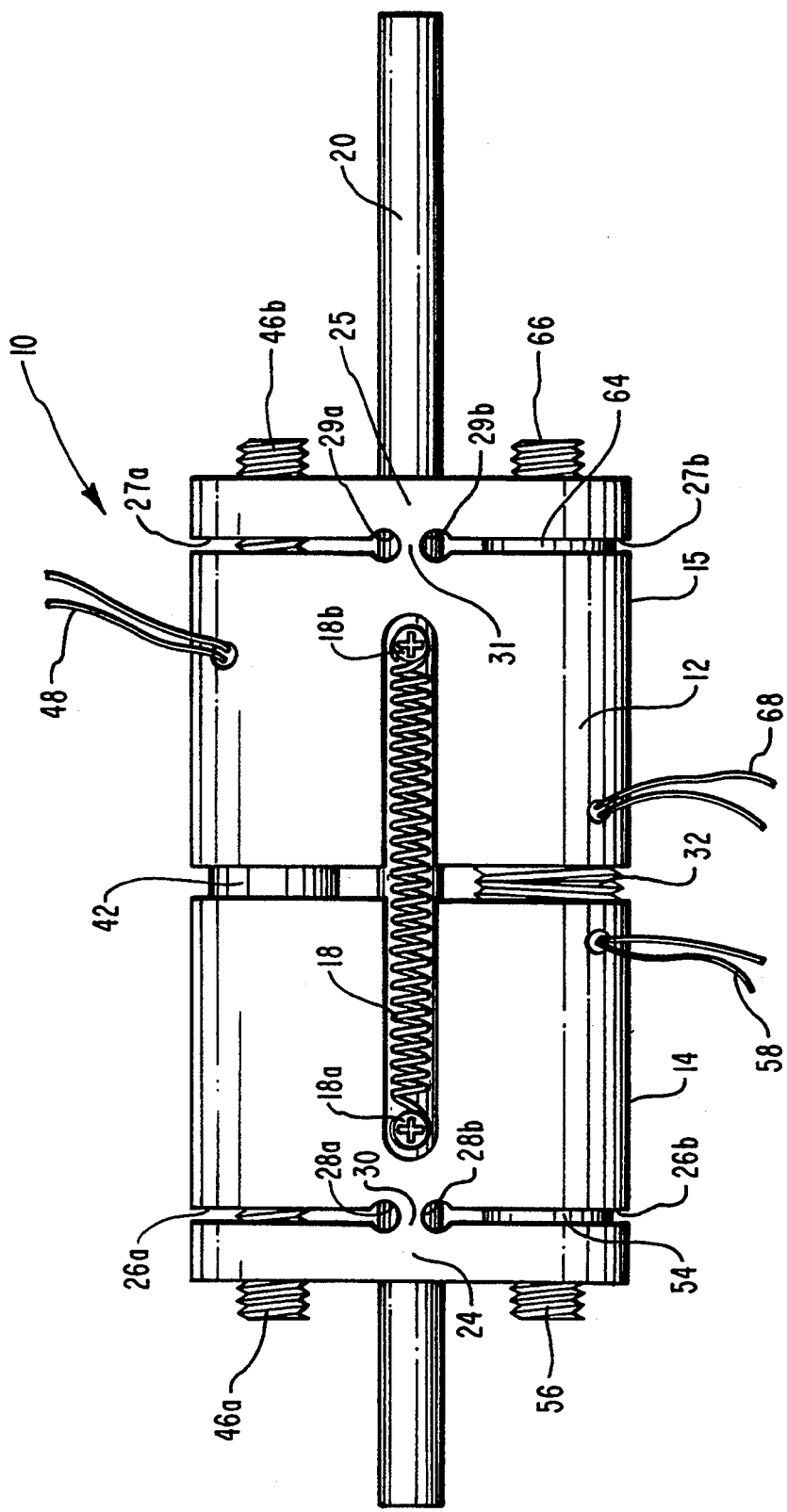
FIG. 1 is a perspective view of a first presently preferred embodiment of the linear actuator of this invention.

The invention is best understood by reference to the drawing wherein like parts are designated by like numerals throughout in conjunction with the following description.

GENERAL DISCUSSION

As early as about 1963 it was discovered that certain heavy rare earth elements have magnetostrictions about 1,000 times greater than iron and about 200 times greater than nickel. However, these enormous magnetostrictions were only present at cryogenic temperatures and were most pronounced in the region of absolute zero. Accordingly, the search for suitable magnetostrictive materials was directed toward combinations of rare earth/transition metals to obtain suitable magnetostriction at room temperature. One such composition was discovered and named Terfanol-D which is the name given to an alloy of terbium, dysprosium, and iron. Terfanol-D has improved on the magnitude of the achievable strains as compared to previously available magnetostrictive materials by a factor of 40 times or even about 10 times that of piezoceramics such as lead titanate zirconate (PZT). Actuators based on Terfanol-D have been shown to transmit large amounts of energy in a small volume and are highly efficient. Terfanol-D systems require relatively low intensity magnetic fields and can operate at low voltages as compared to piezoceramics. Terfanol-D also demonstrates a high modulus and has a rapid response time (5 KHz).

My linear actuator can easily be referred to as an "inch worm" device because of its mode of movement. This device is, in general, conceptually simple although it does require careful design in order to render the concept as an operative device. My linear actuator functions by repetitive clamping, extension, and clamping and thereby provides for very precise microsteps so that it is ideally matched for digital control. The basic concept for the linear actuator is that it functions by clamping a structural element or, more accurately, the drive rod with one magnetostrictive actuator, extend the drive rod forward incrementally with a second magnetostrictive actuator, and clamp the drive rod with a third magnetostrictive actuator at the new position. This sequence is repeated for each incremental step of the linear actuator.

The foregoing design of this invention is of particular interest for a linear actuator for several reasons. First, the two clamping functions and the linear movement function use the full potential of the magnetostrictive motion capability of each magnetostrictive element. Second, the actual wear surfaces are fabricated from a material other than the magnetostrictive material. Third, the driving coils for the magnetostrictive elements can be intimately fitted to the magnetostrictive elements for minimum packing volume. Fourth, and probably most important, the driven element can be a standard metal shaft of any suitable length. Fifth, the necessary fabrication tolerances can be reduced by providing adjustment means on both clamping systems and the linear movement system. Sixth, the linear actuator can be configured as either normally locked or in the normally free travel mode. Seventh, the linear actuator can be operated under digital control and in either direction. Finally, the design of the present invention readily accommodates the development of a variable resistance or force motor in which the clamping forces can be actively controlled by variable voltage input to the two coils of the two clamping elements.

The linear actuator of this invention includes a drive rod, a first clamping mechanism, a second clamping mechanism, and an extension mechanism. The actual operating sequence for the linear actuator is as follows:

1. The first clamping mechanism is clamped to the actuator rod;
2. The extension mechanism is extended pushing the second clamping mechanism forward;
3. The second clamping mechanism is clamped to the actuator rod;
4. The first clamping mechanism is released from the actuator rod;
5. The extension mechanism is relaxed bringing the first clamping mechanism forward;
6. The first clamping mechanism is again clamped to the actuator rod;
7. The second clamping mechanism is released;
8. The extension mechanism is again extended to again push the second clamping mechanism forward;
9. The second clamping mechanism is again clamped to the actuator rod; and
10. The first clamping mechanism is released and brought forward upon relaxation of the extension mechanism to complete this cycle.

DETAILED DESCRIPTION

Referring now to FIG. 1, the novel linear actuator of this invention is shown generally at 10 and includes an actuator housing 12 configured as a left housing 14 and a right housing 15 with a spring 18 coupled to left housing 14 at spring screw 18a and to right housing 15 at spring screw 18b. A drive rod 20 passes through the axis of linear actuator 10 and serves as the movable member for linear actuator 10.

Left housing 14 includes a left clamp 24 while right housing 15 includes a right clamp 25, the functioning of each of which will be discussed more fully hereinafter. Left clamp 24 is machined out of left housing 14 by a pair of end-to-end slots 26a and 26b each of which terminates in an enlarged undercut 28a and 28b, respectively, separated by a resilient spring section 30. Correspondingly, right clamp 25 is machined out of right housing 15 by a pair of end-to-end slots 27a and 27b each of which terminates in an enlarged undercut 29a and 29b, respectively, separated by a resilient spring section 31. Spring sections 30 and 31 are designed to allow left clamp 24 and right clamp 25 to pivot incrementally relative to the respective housing, left housing 14 and right housing 15. This incremental-pivot action for each of left clamp 24 and right clamp 25 creates a corresponding binding action against drive rod 20 to thereby selectively clamp the same as will be discussed more fully hereinafter.

Figure 2:
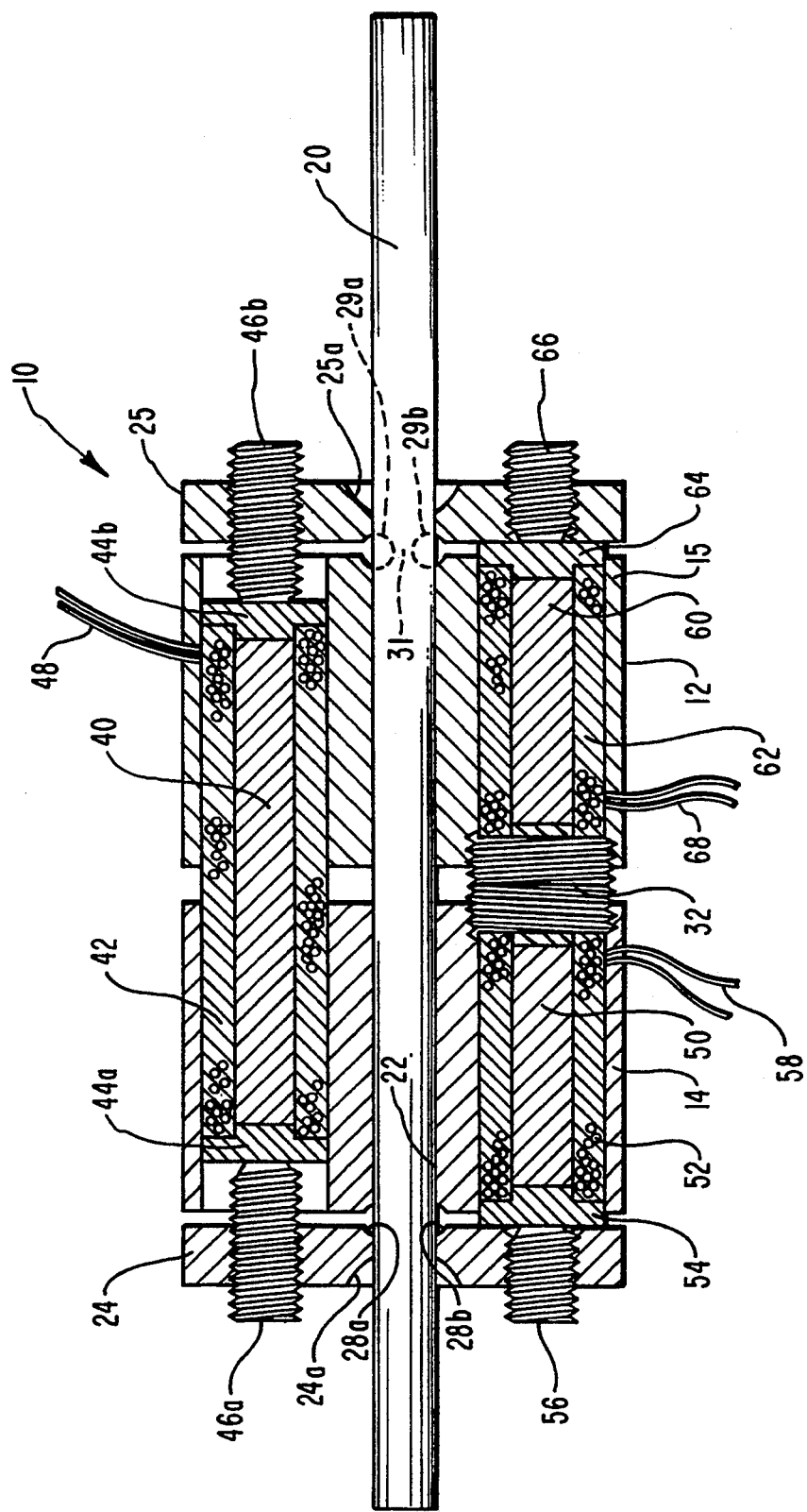
FIG. 2 is a cross-sectional view taken along lines 2—2 of FIG. 1.

Referring now also to FIG. 2, the internal features of linear actuator 10 are shown and include an extension rod 40, a left clamp rod 50 and a right clamp rod 60. Extension rod 40 is surrounded by an electromagnetic coil 42 and has a bearing plate 44a at its left end and a bearing plate 44b at its right end. A left set screw 46a passes in threaded engagement through left clamp 24 into engagement with bearing plate 44a while a right set screw 46b passes in threaded engagement through right clamp 25 into engagement with bearing plate 44b. Left clamp rod 50 is surrounded by an electromagnetic coil 52 and abuts a bearing plate 54. A set screw 56 passes in threaded engagement through left clamp 24 and into engagement with bearing plate 54. Right clamp rod 60 is surrounded by an electromagnetic coil 62 and abuts a bearing plate 64. A set screw 66 passes in threaded engagement through right clamp 25 and into engagement with bearing plate 64. An internal set screw 32 is interposed between left clamp rod 50 and right clamp rod 60.

Electrical power is supplied to electromagnetic coil 42 by an electrical lead 48 while electrical power is supplied to electromagnetic coil 52 by an electrical lead 58 and to electromagnetic coil 62 by an electrical lead 68. Control of the electrical power through each of electrical leads 48, 58, and 68 is selectively controlled by a conventional controller (not shown) to activate each of extension rod 40, left clamp rod 50, and right clamp rod 60, respectively, in order to achieve the desired movement of actuator rod 20 relative to linear actuator 10.

Housing 12 includes a throughbore 22 through which drive rod 20 passes in sliding relationship. Throughbore 22 also extends through left clamp 24 and right clamp 25. Left clamp 24 includes an annular undercut 24a while right clamp 25 includes an annular undercut 25a. Left clamp 24 and right clamp 25 are each shown disposed at a 90 degree angle to actuator rod 20. Clamping action against drive rod 20 is achieved by tilting either of left clamp 24 or right clamp 25 at an angle to create a binding action against drive rod 20.

The first step in the axial movement of drive rod 20 is initiated by activating left clamp rod 50. This is done by directing electrical current through electrical leads 58 into electromagnetic coil 52. The resultant electromagnetic field around left clamp rod 50 causes left clamp rod 50 to elongate incrementally and push against bearing plate 54. This axial force pushes left clamp 24 out of its 90 degree orientation with drive rod 20 and causes left clamp 24 to pivot about spring section 30. This deliberate misalignment of left clamp 24 creates a binding action against drive rod 20 firmly locking it to housing 12.

With left clamp 24 in its clamping position electrical power is directed through electrical lead 48 into electromagnetic coil 42. The resultant electromagnetic field around extension rod 40 causes extension rod 40 to elongate incrementally. Since bearing plate 44a is held firmly by the clamping action of left clamp 24, the resultant elongation of extension rod 40 moves bearing plate 44b to the right relative to drive rod 20. At this juncture, electrical power is now directed through electrical lead 68 into electromagnetic coil 62 to create an electromagnetic field around right clamp rod 60. The resultant elongation of right clamp rod 60 pushes right clamp 25 pivotally about spring section 31 causing a binding action against drive rod 20 by right clamp 25. At this point, electrical power is being directed into each of electromagnetic coils 42, 52, and 62.

Left clamp 24 is now released by stopping electrical power to electromagnetic coil 52. This releases the clamping action of left clamp 24. Electrical power is then discontinued to electromagnetic coil 42 allowing extension rod 40 to return to its original, incrementally shorter length. Spring 18 then pulls left housing 14 toward right housing 15.

Left clamp 24 is again activated to bind drive rod 20 to left housing 14 after which right clamp 25 is deactivated to release drive rod 20 relative to right housing 15. With left clamp 24 activated and right clamp 25 deactivated, extension rod 40 is again activated to push right housing 15 to the right relative to drive rod 20 and against the tension of spring 18. Right clamp 25 is again activated to hold the position of right housing 15 relative to drive rod 20 at which time left clamp 24 is deactivated followed by deactivation of extension rod 40 to cause spring 18 to pull left housing 14 incrementally toward right housing 15. In this manner, housing 12 has been moved to the right relative to drive rod 20 or, more accurately, drive rod 20 has been moved to the left through housing 12.

Reversal of the relative motion of drive rod 20 with respect to housing 12 is accomplished by clamping right clamp 25 against drive rod 20 followed by an extension of extension rod 40 and clamping of left clamp 24. Right clamp 25 is then released followed by relaxation of extension rod 40 to allow spring 18 to pull right housing 15 to the left toward left clamp 24. The sequence is repeated by clamping right clamp 25 against drive rod 20 and release of left clamp 24. Extension of extension rod 40 again moves left clamp 24 to the left where it is again clamped to drive rod 20.

In the foregoing sequences of moving house 12 to either the left or right relative to drive rod 20 it will be noted that one or both of left clamp 24 and right clamp 25 are selectively clamped against drive rod 20 so that housing 12 is engaged to drive rod 20 at any given time. However, for certain applications it is entirely feasible for drive rod 20 to be freely moveable relative to housing 12. Seizure of drive rod 20 and its incremental movement, relative to housing 12 is easily accomplished by the reactivation of the appropriate clamp, left clamp 24 or right clamp 25, followed by a repeat of the preselected sequence in order to accomplish the desired relative movement between housing 12 and drive rod 20.

It is important to note that none of the motive elements, extension rod 40, left clamp rod 50, or right clamp rod 60, are directly subjected to any of the wear-related events such as clamping, etc., as would otherwise be encountered if drive rod 20 were fabricated from a magnetostrictive material. As it is, drive rod 20 can be fabricated from any suitable material such as carbon steel, stainless steel, ceramic, or the like. Additionally, drive rod 20 can be fabricated with any suitable length. This is particularly relevant since a drive rod 20 of any appreciable length would be prohibitively expensive due to the current costs of available magnetostrictive materials suitable for this application.

Advantageously, the design of linear actuator 10 readily lends itself to digital control since its step-like action is repeatable at a fairly high frequency rate. Also, linear actuator 10 can be applied as a variable resistance to the movement of drive rod 20 relative to housing 12 by selectively controlling the voltage input to each of electromagnetic coils 52 and 62 which, in turn, controls the degree of clamping force exerted on drive rod 20 by left clamp 24 and right clamp 25, respectively.

In the illustrated embodiment left clamp 24 and right clamp 25 are shown as binding-type clamps wherein through selective alteration of their alignment relative to drive rod 20 causes a binding action against drive rod 20. However, clamping action against drive rod 20 could also be achieved by configuring each of left clamp 24 and right clamp 25 as constrictive-type clamps (not shown) to achieve the desired clamping action. Regardless of the particular methodology employed to achieve the desired clamping action against drive rod 20, the same sequences are followed as set forth hereinbefore in order to achieve the desired direction of movement of drive rod 20 relative to housing 12.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A linear actuator comprising:
   a housing body comprising a first housing and a second housing;
   a drive rod longitudinally movable relative to said housing;
   a first clamping means operable to clamp the relative position of said first housing to said drive rod;
   a second clamping means operable to clamp the relative position of said second housing to said drive rod; and
   extension means for moving said first clamping means relative to said second clamping means.

2. The linear actuator defined in claim 1 wherein said housing body comprises a spring means for resiliently urging said first housing toward said second housing.

3. The linear actuator defined in claim 1 wherein said first clamping means comprises a first clamp and a first magnetostrictive rod operable to operate said first clamp, and said second clamping means comprises a second clamp and a second magnetostrictive rod operable to operate said second clamp.

4. The linear actuator defined in claim 3 wherein said first clamping means includes a first electromagnetic coil surrounding said first magnetostrictive rod and operable to receive a first electrical energy to thereby create a first electromagnetic field around said first magnetostrictive rod, said first electromagnetic field causing a first length change in said first magnetostrictive rod and wherein said second clamping means comprises a second electromagnetic coil surrounding said second magnetostrictive rod and operable to receive a second electrical energy to thereby create a second electromagnetic field around said second magnetostrictive rod, said second electromagnetic field causing a second length change in said second magnetostrictive rod.

5. The linear actuator defined in claim 4 wherein said first clamping means comprises a first adjustment means for selectively adjusting said first magnetostrictive rod relative to said first clamp and said second clamping means comprises a second adjustment means for selectively adjusting said second magnetostrictive rod relative to said second clamp.

6. The linear actuator defined in claim 3 wherein said first clamp comprises a first arm pivotally mounted to said first housing, said first arm being pivotable by said first magnetostrictive rod to create a first binding action against said drive rod as a first clamping action, and said second clamp comprises a second arm pivotally mounted to said second housing, said second arm being pivotable by said second magnetostrictive rod to create a second binding action against said drive rod as a second clamping action.

7. The linear actuator defined in claim 1 wherein said extension means comprises a third magnetostrictive rod and a third electromagnetic coil surrounding said third magnetostrictive rod, said third electromagnetic coil operable to receive a third electrical energy to thereby create a third electromagnetic field around said third magnetostrictive rod, said third electromagnetic field causing a third length change in said third magnetostrictive rod.

8. The linear actuator defined in claim 7 wherein said first adjustment means includes a first thrust plate interposed between said first adjustment means and said first magnetostrictive rod, and said second adjustment means includes a second thrust plate interposed between said second adjustment means and said second magnetostrictive rod.

9. The linear actuator defined in claim 7 wherein said third magnetostrictive rod comprises a third adjustment means and a fourth adjustment means, said third adjustment means mounted to said first housing for adjustably configuring said third magnetostrictive rod relative to said first housing and said fourth adjustment means mounted to said second housing for adjustably configuring said third magnetostrictive rod relative to said second housing.

10. The linear actuator defined in claim 8 wherein said third adjustment means includes a third thrust plate interposed between said third adjustment means and said third magnetostrictive rod, and said forth adjustment means includes a fourth thrust plate interposed between said fourth adjustment means and said third magnetostrictive rod.

11. A linear actuator comprising:
   a first housing, said first housing including a first clamp formed as a first arm pivotally mounted to said first housing at a first pivot;
   a second housing, said second housing including a second clamp formed as a second arm pivotally mounted to said second housing at a second pivot;
   a drive rod slidably mounted in said first housing and said second housing, said drive rod being operable to be selectively engaged to said first housing by said first clamp and to said second housing by said second clamp;
   spring means for resiliently urging said first housing toward said second housing;
   a first magnetostrictive rod in said first housing, said first magnetostrictive rod being selectively operable to pivot said first arm relative to said first housing thereby engaging said drive rod to said first housing;
   a second magnetostrictive rod in said second housing, said second magnetostrictive rod being selectively operable to pivot said second arm relative to said second housing thereby engaging said drive rod to said second housing; and
   a third magnetostrictive rod slidably mounted in said first housing and said second housing, said third magnetostrictive rod being in abutment against said first arm and said second arm, said third magnetostrictive rod being selectively operable to incrementally displace outwardly said first arm relative to said second arm.

12. The linear actuator defined in claim 11 wherein said first arm includes a first adjustment means for adjustably positioning said first arm relative to said first magnetostrictive rod and said second arm includes a second adjustment means for adjustably positioning said second arm relative to said second magnetostrictive rod, and wherein said first arm also includes a third adjustment means for adjustably positioning said first arm relative to said third magnetostrictive rod and said second arm also includes a fourth adjustment means for adjustably positioning said second arm relative to said third magnetostrictive rod.

13. The linear actuator defined in claim 12 wherein said first adjustment means includes a first thrust plate between said first adjustment means and said first magnetostrictive rod, said second adjustment means includes a second thrust plate between said second adjustment means and said second magnetostrictive rod, said third adjustment means includes a third thrust plate between said third adjustment means and said third magnetostrictive rod, and said fourth adjustment means includes a fourth thrust plate between said fourth adjustment means and said third magnetostrictive rod.

14. The linear actuator defined in claim 11 wherein said first magnetostrictive rod comprises a first electromagnetic coil surrounding said first magnetostrictive rod and operable to create a first electromagnetic field around said first magnetostrictive rod, said second magnetostrictive rod comprises a second electromagnetic coil surrounding said second magnetostrictive rod and operable to create a second electromagnetic field around said second magnetostrictive rod, and said third magnetostrictive rod comprises a third electromagnetic coil surrounding said third magnetostrictive rod and operable to create a third electromagnetic field around said third magnetostrictive rod.

15. A method for producing linear motion between a linear actuator and a drive rod comprising the steps of:
selecting said drive rod;
preparing a housing body for said linear actuator and slidably mounting said housing body to said drive rod;
forming a first housing and a second housing in said housing body;
configuring a first clamping means on said first housing and a second clamping means on said second housing, said first clamping means being selectively operable for binding said drive rod to said first housing and said second clamping means being selectively operable for binding said drive rod to said second housing;
inserting an extension member in said housing body, said extension member being slidable in said first housing and said second housing and in abutment between said first clamping means and said second clamping means;
resiliently urging said first housing toward said second housing;
moving said housing body relative to said drive rod by clamping said drive rod with said first clamping means and extending said extension member thereby pushing said second clamping means incrementally away from said first clamping means and clamping said drive rod with said second clamping means followed by releasing said first clamping means and relaxation of said extension means thereby resiliently urging said first clamping means toward said second clamping means; and
repeating said moving step thereby creating step-wise relative movement between said housing body and said drive rod.

16. The method defined in claim 15 wherein said configuring step comprises forming said first clamping means as a first arm pivotally affixed to said first housing and having a first magnetostrictive rod interconnecting said first arm and said first housing, said first magnetostrictive rod selectively pushing said first arm and thereby binding said drive rod relative to said first housing, and wherein said configuring step also comprises forming said second clamping means as a second arm pivotally affixed to said second housing and having a second magnetostrictive rod interconnecting said second arm and said second housing, said second magnetostrictive rod selectively pushing said second arm and thereby binding said drive rod relative to said second housing.

17. The method defined in claim 16 wherein said forming step includes placing a first adjustment means on said first arm and a second adjustment means on said second arm, said first adjustment means adjustably fixing a first spatial relationship between said first arm and said first magnetostrictive rod, said second adjustment means adjustably fixing a second spatial relationship between said second arm and said second magnetostrictive rod, said first spatial relationship including a first thrust plate and said second spatial relationship including a second thrust plate.

18. The method defined in claim 15 wherein said inserting step comprises forming said extension member from a third magnetostrictive rod, said third magnetostrictive rod selectively pushing said second clamping means relative to said first clamping means.

19. The method defined in claim 18 wherein said forming step includes placing a third adjustment means and a third thrust plate between said first clamping means and a said third magnetostrictive rod and a fourth adjustment means and a fourth thrust plate between said second clamping means and said third magnetostrictive rod.

* * * * *